United States Patent
Chang

(10) Patent No.: US 6,887,357 B2
(45) Date of Patent: May 3, 2005

(54) SPUTTERING SYSTEM

(75) Inventor: Soo Chang Chang, Cheollabuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/076,097

(22) Filed: Feb. 15, 2002

(65) Prior Publication Data
US 2002/0170822 A1 Nov. 21, 2002

(30) Foreign Application Priority Data
Feb. 15, 2001 (KR) .......................... P2001-7494

(51) Int. Cl.[7] .............................................. C23C 14/35
(52) U.S. Cl. ................. 204/298.2; 204/298.19
(58) Field of Search ................. 204/298.09, 298.19, 204/298.2

(56) References Cited

U.S. PATENT DOCUMENTS 5,262,030 A * 11/1993 Potter ....................... 204/298.2

* cited by examiner

Primary Examiner—Rodney G. McDonald
(74) Attorney, Agent, or Firm—Morgan Lewis & Bockius LLP

(57) ABSTRACT

A sputtering system for depositing a thin film on a substrate includes a vacuum chamber, a support for supporting the substrate in the vacuum chamber, a target arranged to oppose the support, a fixed plate formed on a first side of the target, and a plurality of electromagnets formed on the fixed plate in a cell pattern.

16 Claims, 10 Drawing Sheets

SPUTTERING SYSTEM

The present invention claims the benefit of Korean Patent Application No. P2001-007494 filed in Korea on Feb. 15, 2001, which is hereby incorporated by reference.

BACKGROUND OF THE INVENTION

1. Field of the Invention

The present invention relates to a sputtering system, and more particularly, to a magnetron sputtering system using electromagnets.

2. Discussion of the Related Art

Generally, sputtering is a technique for forming a metal thin film and an insulating film on a substrate, wherein physical deposition processes are used rather than vacuum deposition processes. In addition, different sputtering techniques include diode DC sputtering, triode sputtering, and magnetron sputtering.

FIG. 1 illustrates a magnetron sputtering system according to the prior art. In FIG. 1, the sputtering system includes load locks 101 and 102, a heater chamber 103, processing chambers 104, 105, and 106, and a transfer chamber 107. The load locks 101 and 102 attenuate any pressure differential prior to introducing a substrate into the processing chambers 104, 105, and 106 where deposition is performed. The heater chamber 103 performs pre-heating of the substrate prior to the introduction into the processing chambers 104, 105, and 106. The processing chambers 104, 105, and 106 include various driving units and a target for material deposition. The transfer chamber 107 includes a vacuum processing robot for transferring each substrate between each of the individual processing chambers 104, 105, and 106, a well as between the load locks 101 and 102 and the processing chambers 104, 105, and 106.

FIG. 2 illustrates an inner structure of one of the process chambers according to the prior art. In general, sputtering processes are performed within a vacuum chamber filled with Argon gas. The process chamber includes a target 201 having a straight-line plate shaped section comprising deposition materials, a fixed plate 202 for fixing the target 201, and a magnet 203 located at a rear side of the fixed plate 202 for forming an electric field in the target 201. The electric field generated by the magnet 203 confines electrons emitted from the target 201, thereby forming a plasma region around the target 201. A platen 204 is located at a bottom side of the chamber for modulating an interval from the target 201 during deposition processing of a film.

In a magnetron sputtering system, a cathode electrode is generally connected to a target. Then, a positive potential is applied to a substrate of a deposition object, so that an electron is emitted from the target toward the substrate. The emitted electron and Argon gas injected into the chamber react with each other to ionize the Argon gas, thereby forming a plasma region around the target. Accordingly, the highly energized Argon ion located within the plasma region collides with the target, thereby detaching material of the target. Then, the detached material is deposited onto the substrate.

FIG. 3 is a perspective view showing a magnet chamber according to the prior art.

In FIG. 3, a magnet 203 controls a flow of electrons, and scans to form a plasma by moving left and right. Alternatively, the magnet 203 may also scan to form a plasma by moving up and down. A ball shaft 206 is formed at a predetermined portion at a lateral side of the magnet 203 to transmit a driving force to maintain scanning of the magnet 203. A motor (not shown) is connected to a front end of the ball shaft 206. Since the ball shaft 206 is the weakest part of the magnet driving unit, structural improvements of the ball shaft 202 are required. In addition, a linear motion guide 207 is provided in a perpendicular direction to the magnet 203, and strengthens lateral side forces applied to the magnet 203 and the ball shaft 206.

However, the related art magnetron sputtering system has the following problems. First, a plasma that is generated will be inclined towards a specific region because of the magnetic field that is produced by a large sized magnet, thereby causing deposition of a thin film having a non-uniform thickness. In addition, once a first thin film is deposited having a non-uniform thickness, it is impossible to deposit any additional thin films, thereby lowering yield. FIG. 4 is a diagram demonstrating differences in thin film thickness across a surface of a substrate when using a sputtering system according to the prior art. In FIG. 4, black parts have a thickness that are larger than a thickness of the white parts. Second, since the magnetic is mechanically driven by a motor, and the ball shaft has a maximum operational speed, the deposition speed of the sputtering system according to the prior art is limited. Third, when driving the magnet during the deposition process, significant vibration is generated and is transmitted to the entire sputtering system, thereby negatively influencing durability of individual components of the sputtering system.

SUMMARY OF THE INVENTION

Accordingly, the present invention is directed to a sputtering system that substantially obviates one or more problems due to limitations and disadvantages of the related art.

An object of the present invention is to provide a sputtering system that deposits thin film material of a uniform thickness upon a substrate.

Additional advantages, objects, and features of the invention will be set forth in part in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a sputtering system for depositing a thin film on a substrate includes a vacuum chamber, a support for supporting the substrate in the vacuum chamber, a target arranged to oppose the support, a fixed plate formed on a first side of the target, and a plurality of electromagnets formed on the fixed plate in a cell pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
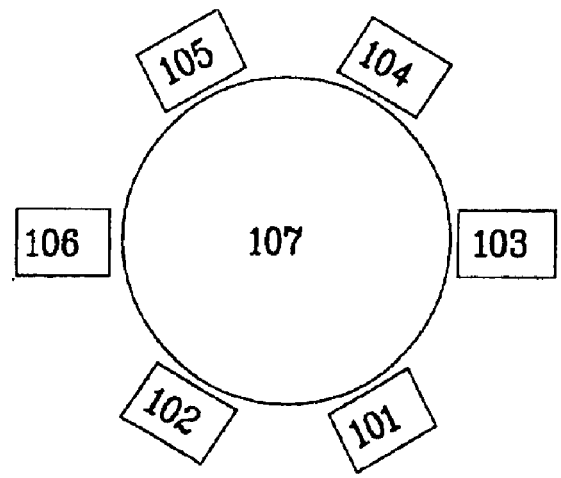
FIG. 1 is a plane view showing a general sputtering device according to the prior art.
Figure 2:
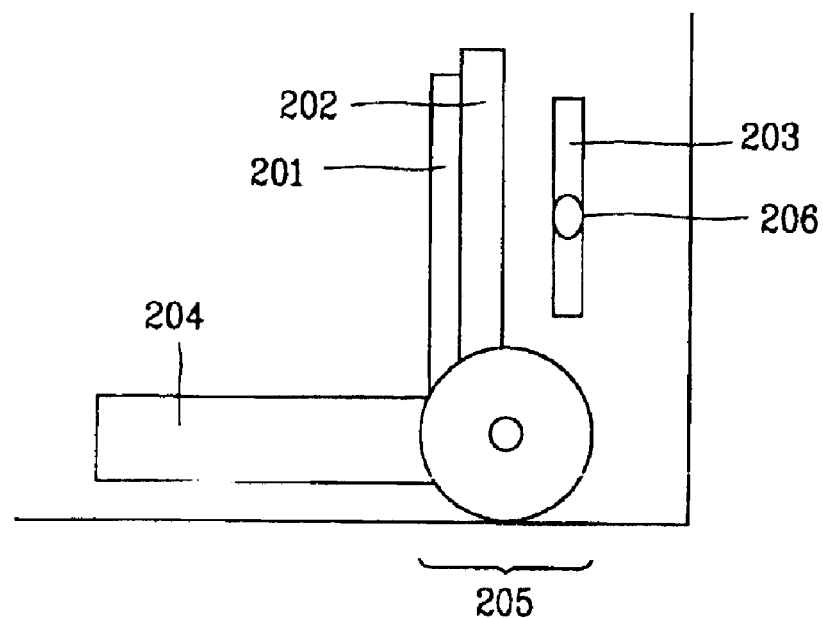
FIG. 2 is a cross sectional view of a process chamber of a sputtering system according to the prior art.
Figure 3:
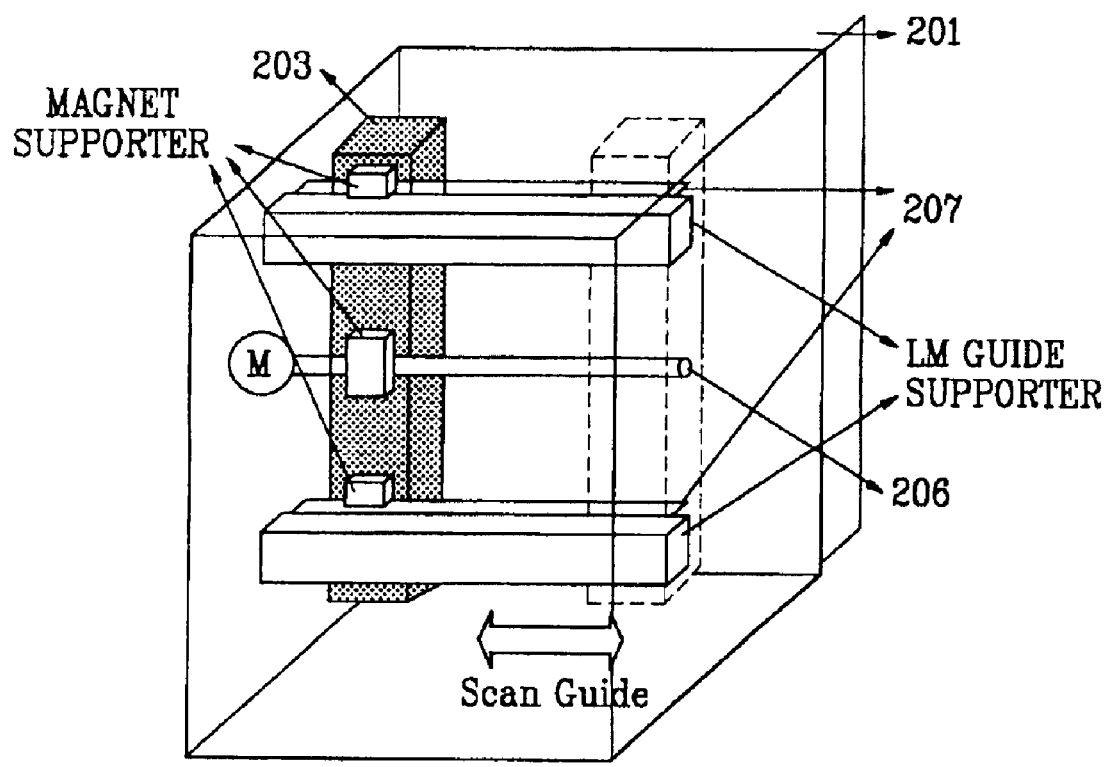
FIG. 3 is a perspective view of a magnet chamber of a sputtering system according to the prior art.
Figure 4:
FIG. 4 is a diagram demonstrating differences in thin film thickness when using a sputtering system according to the prior art.
Figure 5:
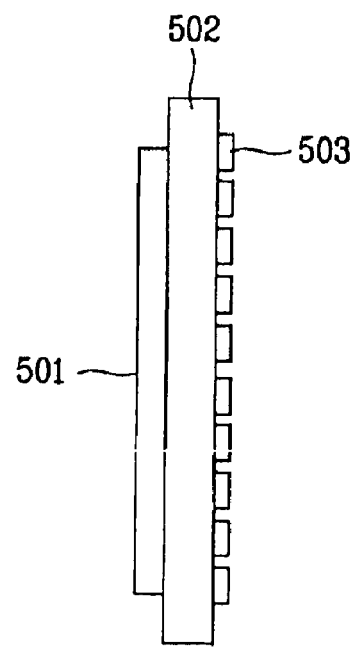
FIG. 5 is cross sectional view of an exemplary sputtering system according to the present invention.
Figure 6:
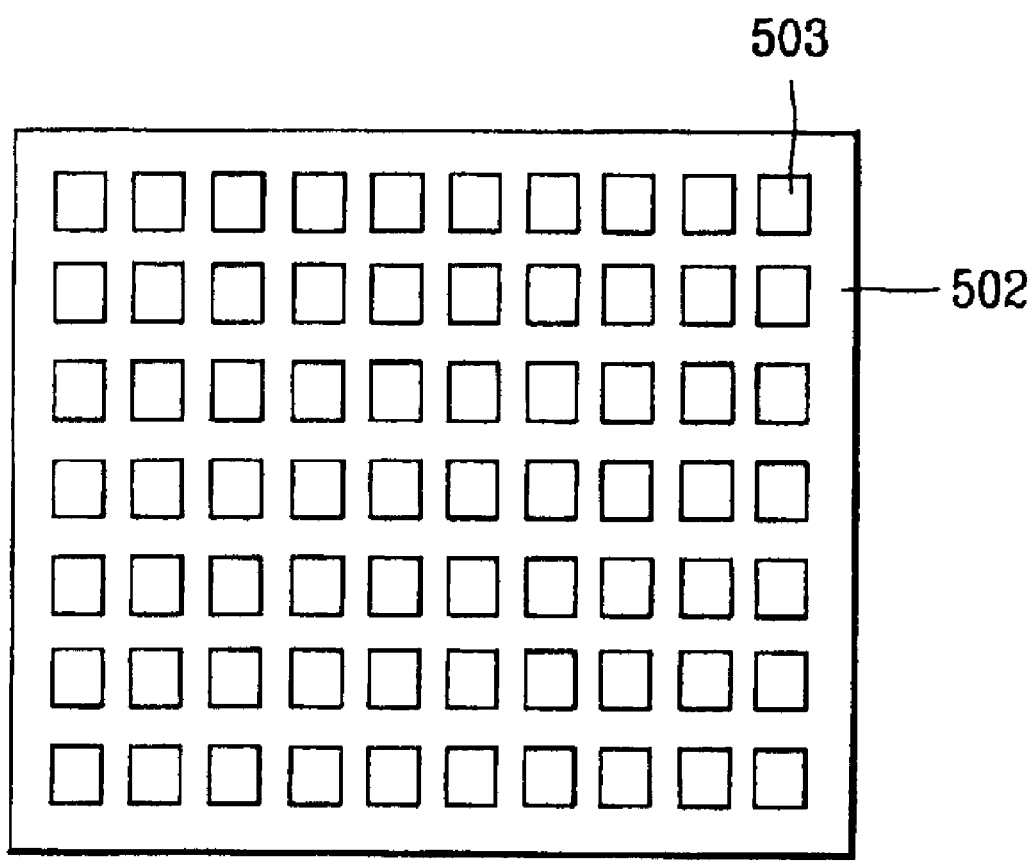
FIG. 6 is plan view of the exemplary sputtering system target of FIG. 5 according to the present invention.
Figure 7:
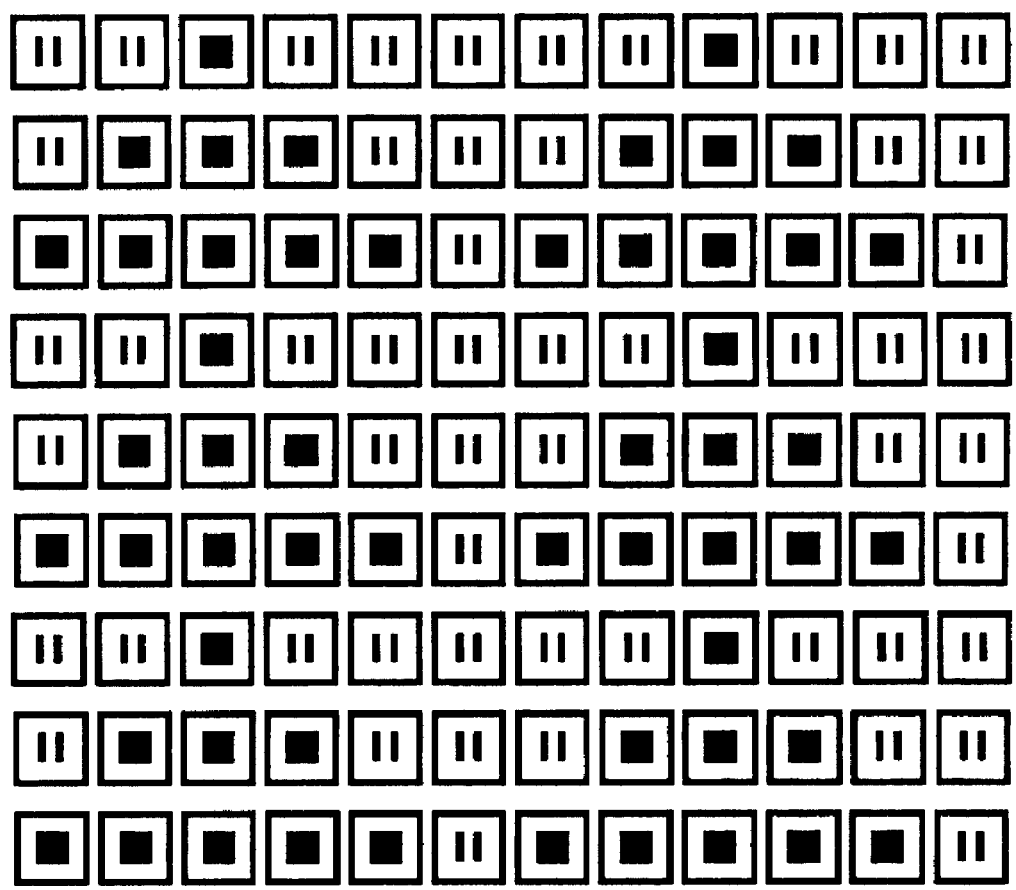
FIGS. 7–12 are plan views of the exemplary sputtering system target of FIG. 5 according to the present invention.
Figure 8:
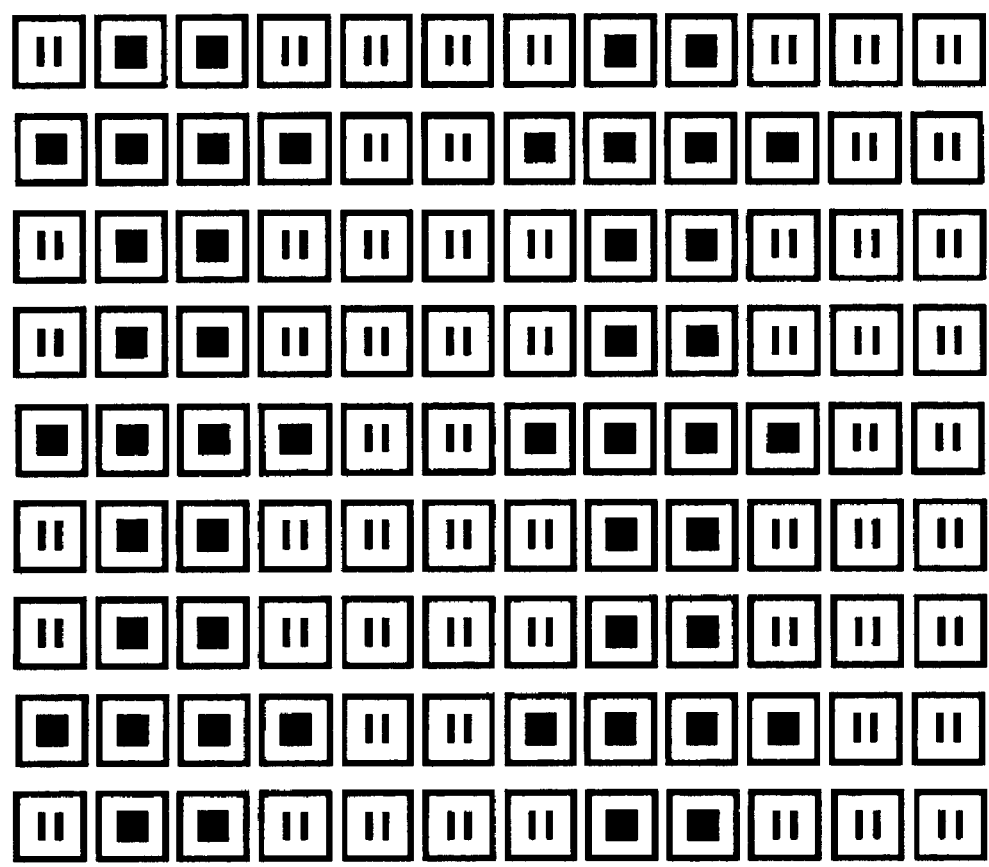
Figure 9:
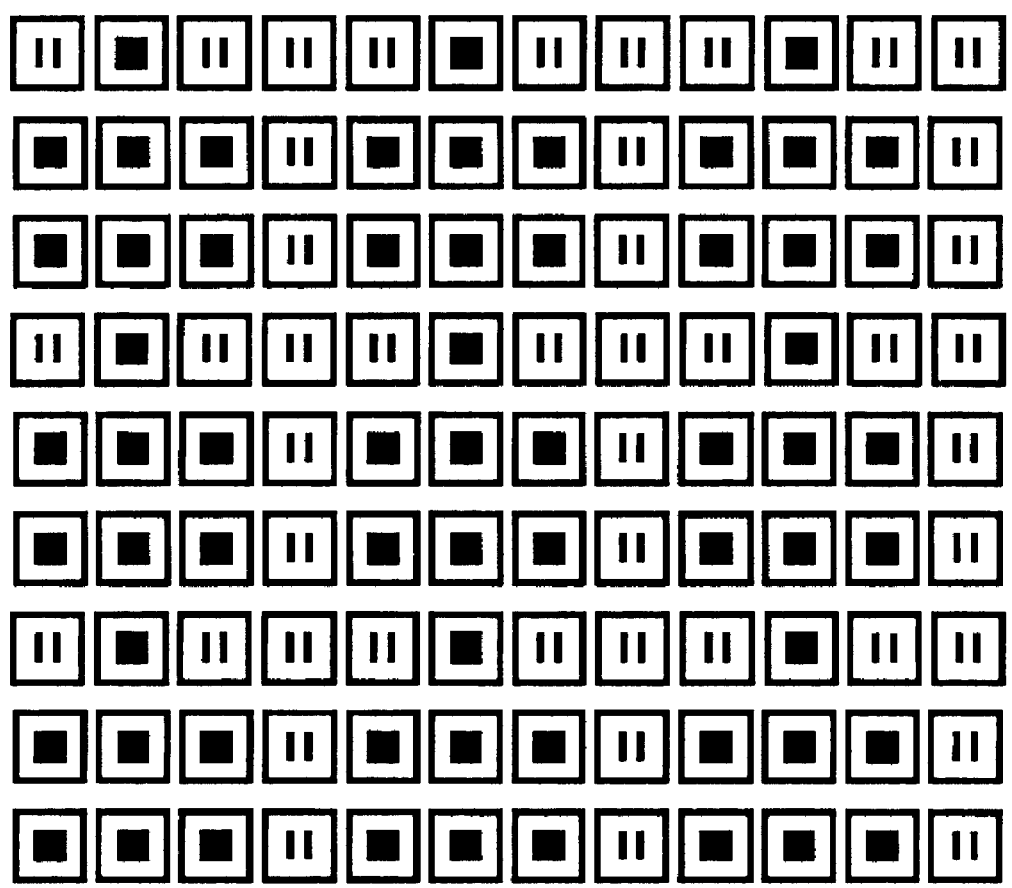
Figure 10:
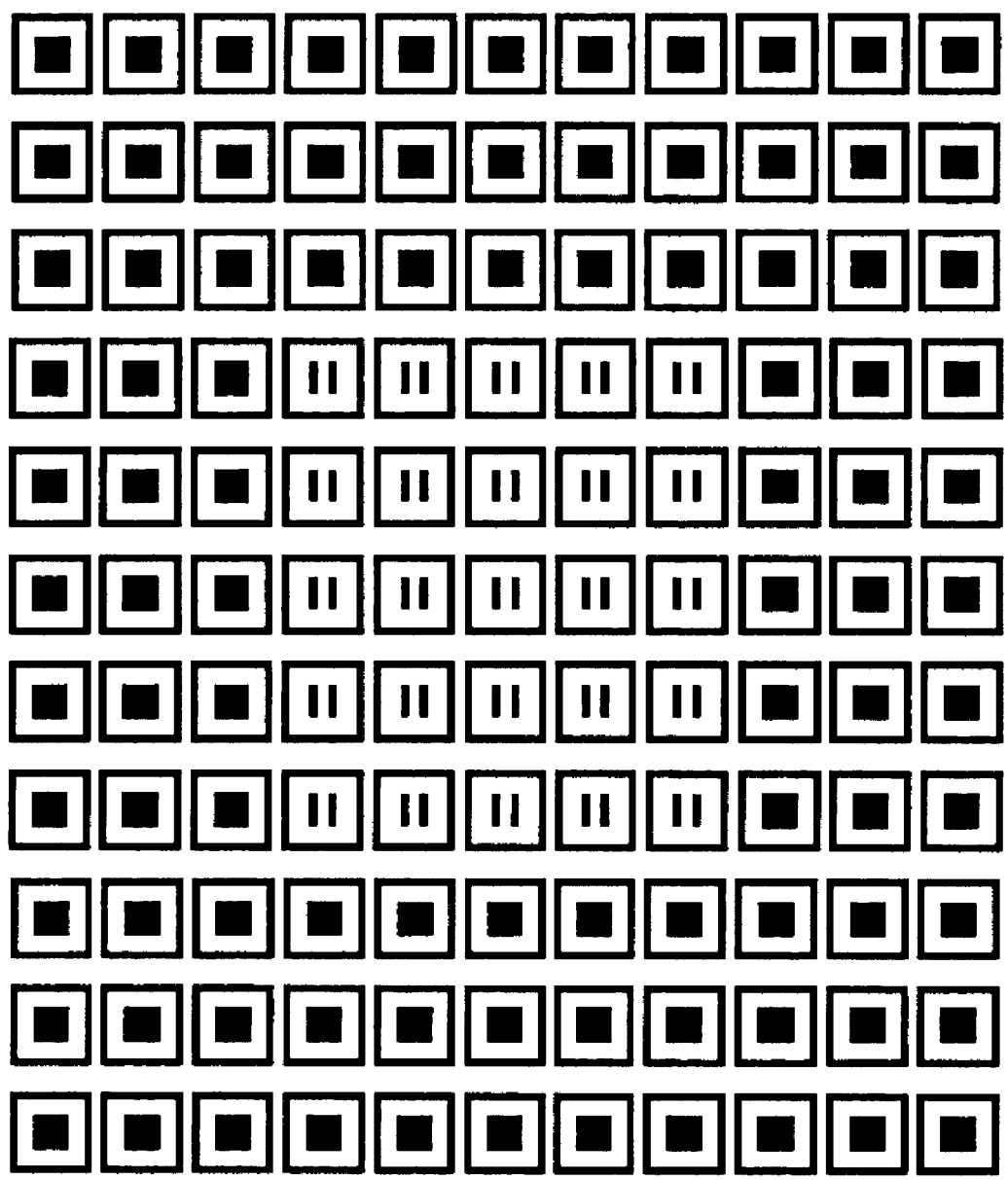
Figure 11:
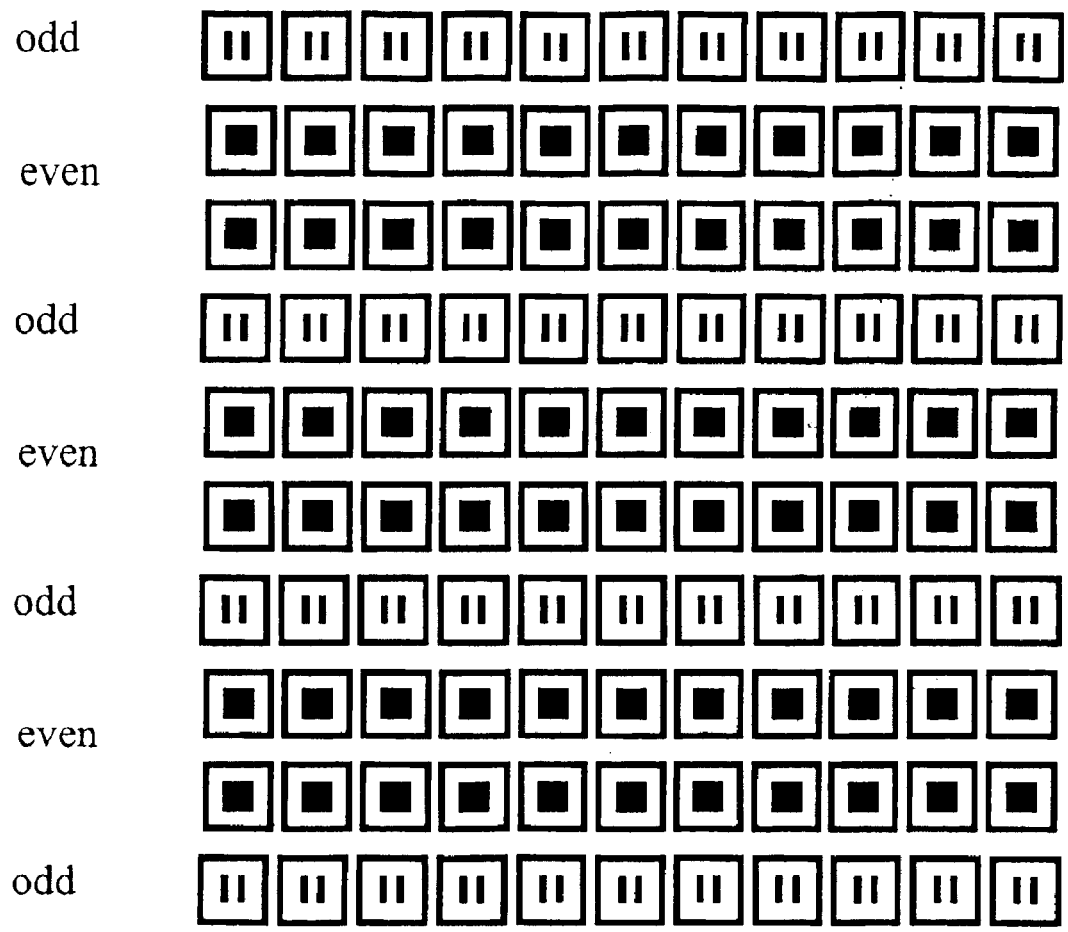
Figure 12:
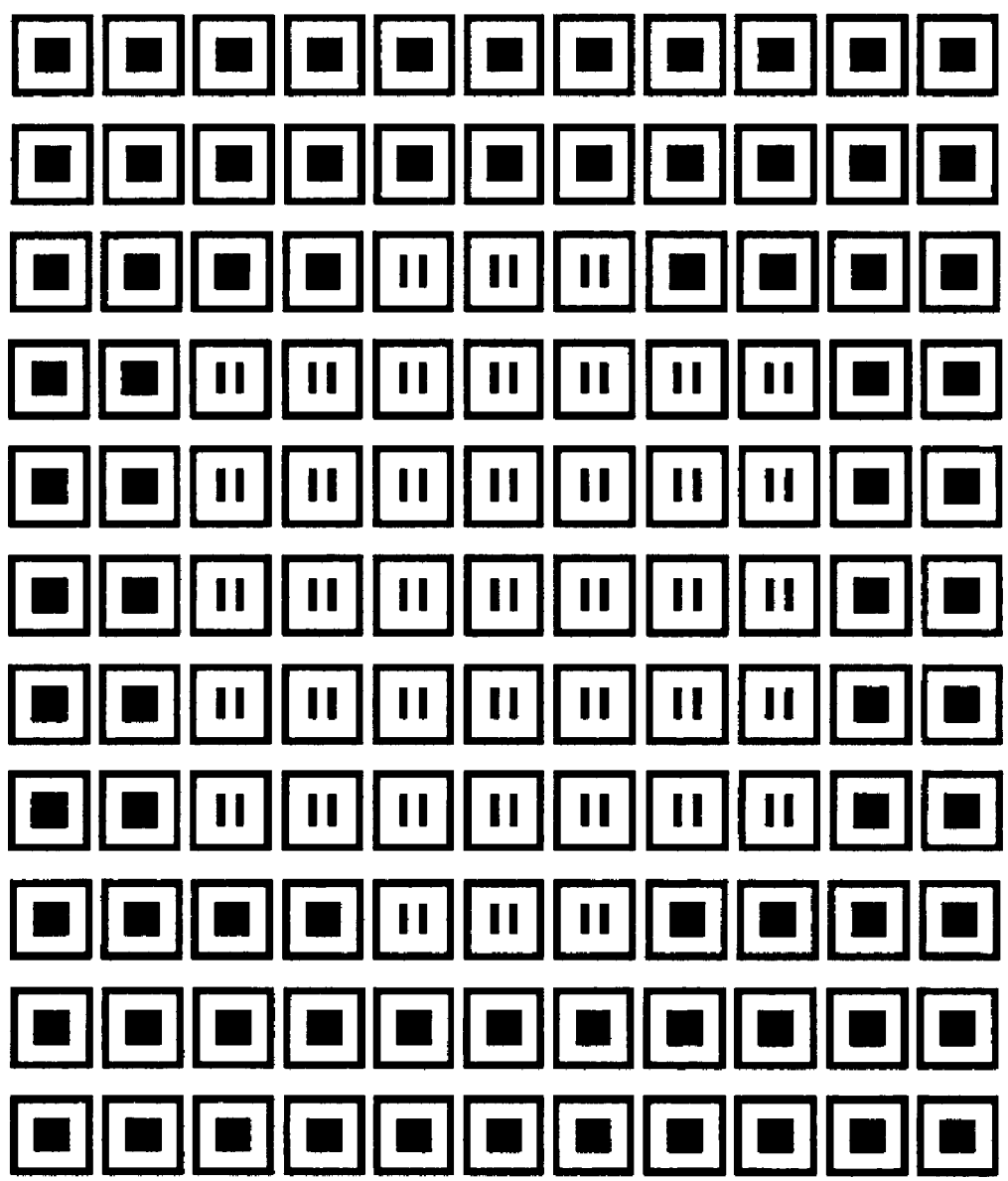

FIGS. 5 and 6 are cross sectional and plan views of an exemplary magnet chamber of an exemplary sputtering system according to the present invention. In FIGS. 5 and 6, a sputtering system includes a target 501 comprising materials for deposition upon a substrate, a fixed plate 502 for controlling a temperature of the target 501 and for supporting the target 501 at a rear side thereof, and small electromagnets 503 disposed on the fixed plate 502. The electromagnets 503 disposed on the fixed plate 502 may each have a size corresponding to a size of the target 501, and may be independently controlled. In addition, the electromagnets 503 may be controlled by application of an electrical signal even when a local deposition is inferior, thereby enabling localized deposition. Moreover, a scanning speed and direction of the target 501 may be determined for specific deposition rates and locations. Accordingly, since the sputtering system according to the present invention is driven by an electrical signal, a mechanical driving unit, as required in the related art, may not be necessary, thereby improving durability characteristic of the sputtering system.

Although the electromagnets 503 shown in FIG. 6 have a specific geometrical shape, other geometrical shapes may be applicable based upon desired deposition of materials. For example, each of the electromagnets 503 may have the same individual geometrical shape such as circular, rectangular, or hexagonal geometric shapes, and may be individually controlled. In addition, each of the electromagnets 503 may have different individual geometrical shapes. For example, electromagnets disposed around an outer perimeter of the fixed plate may have a first geometrical shape and electromagnets disposed within a center portion of the fixed plate may have a second geometrical shape, and both the first and second geometrical shaped electromagnets may be individually controlled. Alternatively, electromagnets in different rows or columns may have different geometrical shapes. For example, electromagnets in even numbered rows or columns may have a first geometrical shape and electromagnets in odd numbered rows or columns may have a second geometrical shape, and each row or column may be individually controlled.

Although the electromagnets 503 are shown in FIG. 6 to have a specific geometrical arrangement, other geometrical arrangements, such as triangular, pentagonal, and hexagonal array patterns, may be applicable based upon desired deposition of materials. Exemplary different geometrical arrangement patterns are shown in FIGS. 7–12. For example, electromagnets disposed around an outer perimeter of the fixed plate may have a first matrix row/column arrangement and electromagnets disposed within a center portion of the fixed plate may have a second non-matrix arrangement such as a circular arrangement, for example, and both the first and second arrangements may be individually controlled.

It will be apparent to those skilled in the art than various modifications and variations can be made in the sputtering system of the present invention without departing from the spirit or scope of the invention. Thus, it is intended that the present invention cover the modifications and variations of this invention provided they come within the scope of the appended claims and their equivalents.

What is claimed is:

1. A sputtering system for depositing a thin film on a substrate, comprising:
   a vacuum chamber;
   a support for supporting the substrate in the vacuum chamber;
   a target arranged to oppose the support;
   a fixed plate formed on a first side of the target; and
   a plurality of electromagnets formed having different geometrical group cell patterns on the fixed plate,
   wherein at least two of the geometrical group cell patterns have electromagnets of different geometrical shapes, respectively.

2. The system according to claim 1, wherein the plurality of electromagnets are individually controlled.

3. The system according to claim 1, wherein the geometrical group cell patterns include first and second group cell patterns that are separately controlled.

4. The system according to claim 3, wherein the first group cell pattern includes at least a first group of the plurality of electromagnets having one of a triangular, pentagonal, and hexagonal array pattern.

5. The system according to claim 4, wherein the second group cell pattern includes at least a second group of the plurality of electromagnets having one of a triangular, pentagonal, and hexagonal array pattern.

6. The system according to claim 5, wherein the first group cell pattern of the plurality of electromagnets is independently controlled from the second group cell pattern of the plurality of electromagnets.

7. The system according to claim 1, wherein the geometrical group cell patterns include first and second group cell patterns that include a matrix array pattern of the plurality of electromagnets.

8. The system according to claim 1, wherein the geometrical group cell patterns include first and second group cell patterns that include a hexagonal array pattern of the plurality of electromagnets.

9. The system according to claim 1, wherein the geometrical group cell patterns include a first cell pattern disposed along an outer perimeter of the fixed plate, and a second group cell pattern disposed within a center portion of the fixed plate.

10. The system according to claim 9, wherein the first and second group cell patterns are individually controlled.

11. The system according to claim 1, wherein the geometrical group cell patterns includes a first group cell pattern disposed along even-numbered rows, and a second group cell pattern disposed along odd-numbered rows.

12. The system according to claim 11, wherein the first and second group cell patterns are individually controlled.

13. The system according to claim 1, wherein the geometrical group cell patterns includes a first group cell pattern disposed in a first matrix arrangement around an outer perimeter of the fixed plate, and a second group cell patterns disposed in a second matrix arrangement different from the first matrix arrangement within a center portion of the fixed plate.

14. The system according to claim 13, wherein the first and second group cell patterns are individually controlled.

15. The system according to claim 13, wherein the second matrix arrangement includes a circular arrangement around the center portion of the fixed plate.

16. The system according to claim 15, wherein the first and second group cell patterns are individually controlled.

* * * * *